(12) United States Patent
Marchione

(10) Patent No.: US 7,250,761 B1
(45) Date of Patent: Jul. 31, 2007

(54) MAGNETIC RESONANCE IMAGING EQUIPMENT STAND

(76) Inventor: Robert L. Marchione, P.O. Box 410, Randolph, VT (US) 05060

( * ) Notice: Subject to any disclaimer, the term of this patent is extended or adjusted under 35 U.S.C. 154(b) by 0 days.

(21) Appl. No.: 11/339,725

(22) Filed: Jan. 25, 2006

Related U.S. Application Data

(60) Provisional application No. 60/662,865, filed on Mar. 18, 2005, provisional application No. 60/646,713, filed on Jan. 25, 2005.

(51) Int. Cl.
 *G01V 3/00* (2006.01)
(52) U.S. Cl. .................................. 324/300; 324/307
(58) Field of Classification Search ........ 324/300–322; 600/564, 567, 407; 606/1, 130
See application file for complete search history.

(56) References Cited

U.S. PATENT DOCUMENTS

| 5,820,623 | A * | 10/1998 | Ng | 606/1 |
| 6,030,348 | A * | 2/2000 | Unger et al. | 600/564 |
| 6,702,805 | B1 * | 3/2004 | Stuart | 606/1 |
| 6,786,896 | B1 * | 9/2004 | Madhani et al. | 606/1 |
| 2004/0149874 | A1 * | 8/2004 | Stoianovici et al. | 248/276.1 |
| 2004/0171923 | A1 * | 9/2004 | Kalafut et al. | 600/407 |
| 2006/0161039 | A1 * | 7/2006 | Juliana et al. | 600/9 |

* cited by examiner

*Primary Examiner*—Brij Shrivastav
(74) *Attorney, Agent, or Firm*—William Nitkin

(57) ABSTRACT

A magnetic resonance imaging equipment stand made of nonmagnetic materials having a supported counterbalanced adjustable angular arm supporting a vertically disposed mounting arm having a mount support thereon for holding selected medical equipment.

8 Claims, 3 Drawing Sheets

MAGNETIC RESONANCE IMAGING EQUIPMENT STAND

This application claims priority and benefit of a provisional patent application entitled Magnetic Resonance Imaging Counterpoised Equipment Stand, Ser. No. 60/646,713 filed Jan. 25, 2005, now pending, and provisional patent application entitled Magnetic Resonance Imaging Equipment Stand, Ser. No. 60/662,865 filed Mar. 18, 2005, now pending.

BACKGROUND OF THE INVENTION

1. Field of the Invention

The invention resides in the field of magnetic resonance imaging counterpoised equipment supports and more particularly relates to a equipment stand providing improved equipment placement, improved ergonomics and safety within the highly magnetic environment of magnetic resonance medical imaging equipment and other highly magnetic environment.

2. History of the Prior Art

During the past thirty years magnetic resonance imaging technology has found its way from an experimental medical imaging modality to everyday medical imaging use. Magnetic resonance imaging has become the imaging tool not only of every day use, but also of necessity. Now in the twenty-first century physicians and scientists have begun exploring the expansion of its usefulness. Thereby, it has become a tool of ever-expanding diagnosis and treatment. Today we are seeing an expansion of not only its diagnostic uses, but also its interventional treatment use as a stand-alone imaging modality and in combination with other forms of medical imaging.

Magnetic resonance imaging provides the ability to see within the body based on the use of a magnetic field. Unlike x-ray images, the image that magnetic resonance imaging provides is one of the chemical composition of structure, based on the ability of each biochemical to alter, ever so slightly, the highly refined intense magnetic field generated by a huge electromagnet.

Broader application and proliferation of use have brought about the need for devices which are capable of safely working within the magnetic resonance imaging environment of an intense magnetic field generated by a huge electromagnet. In this environment where the magnetic field is so intense items of common and conventional medical and scientific equipment can become dangerous projectiles. There is a need for appropriate and safe equipment. Within this environment the material makeup of any equipment, especially that which is closest to the patient, must be carefully designed and engineered so as not to adversely affect the magnetic field or the resultant images.

SUMMARY OF THE INVENTION

The invention herein is a magnetic resonance imaging counterpoised equipment stand that can be used safely within the magnetic resonance imaging environment with minimized magnetic field distortion. The equipment stand of this invention provides a counterbalanced arm with adjustable weight support range which arm is designed to move vertically, horizontally and laterally. Different forms of medical equipment can be supported thereon and maneuvered, correctly and conveniently positioned within the magnetic resonance lab and within the magnetic field where it is directly exposed to the intense magnetic force of the magnetic field. The equipment stand of this invention utilizes nonferrous parts of less than 3 Teslar measured magnetic attraction. It is important to note that the device of this invention must be able to function successfully in a strong magnetic field while at the same time not affecting the magnetic field itself or the quality or content of the imaging of the patient in that field.

DESCRIPTION OF THE PREFERRED EMBODIMENT(S)

Figure 1:
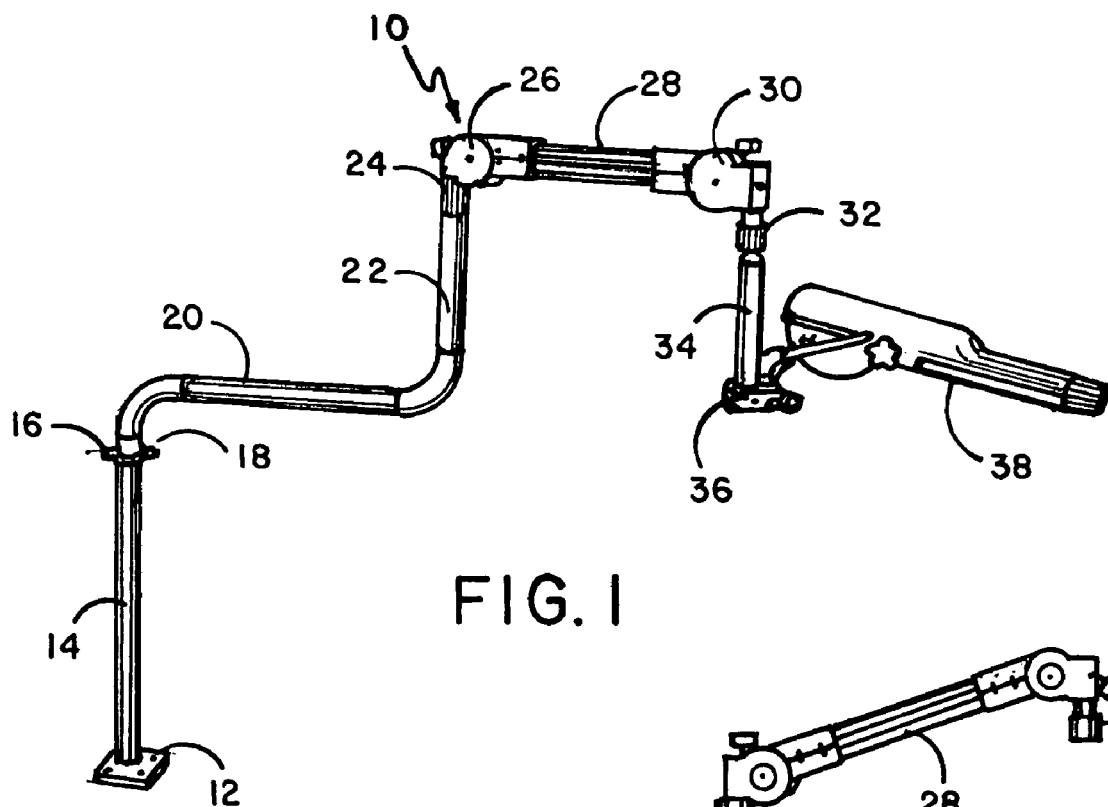
FIG. 1 illustrates a perspective view of the support arm of the equipment stand of this invention showing an arterial pressure injector device mounted thereon for illustrative purposes.
Figure 2:
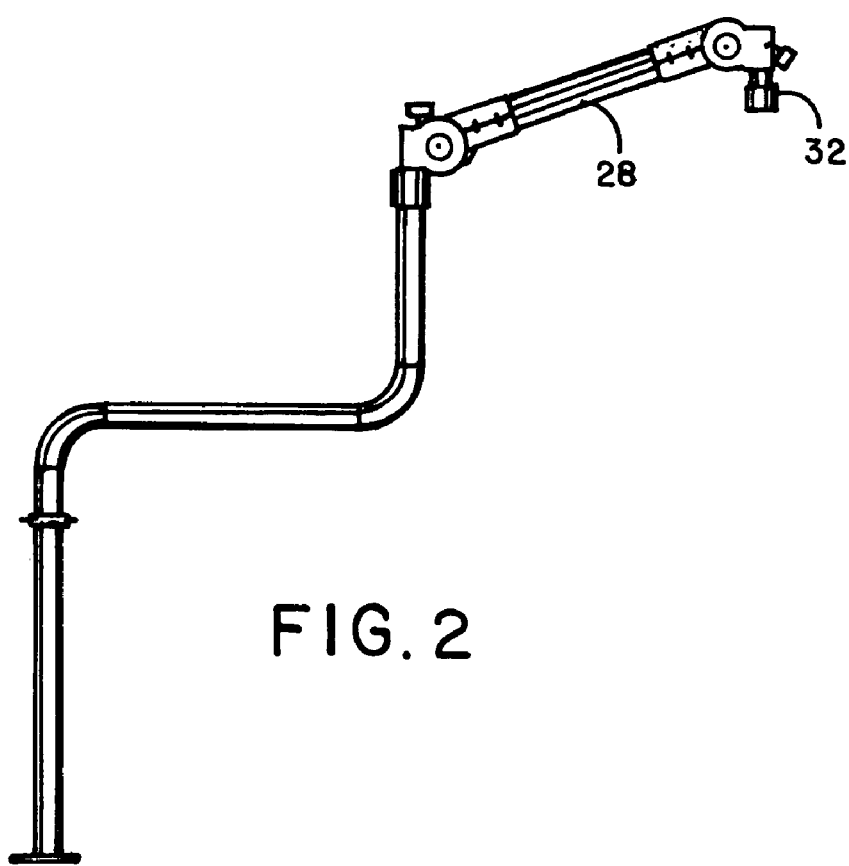
FIG. 2 illustrates a side elevational view of the equipment stand with the arterial pressure injector device removed therefrom and showing the counterbalanced arm in a raised position.
Figure 3:
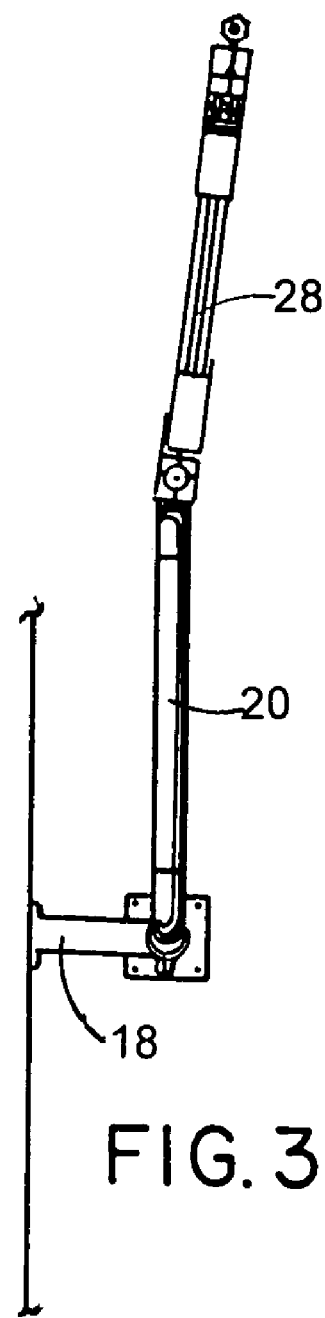
FIG. 3 illustrates a top plan view of the support arm.

FIG. 1 illustrates a first embodiment of equipment stand 10 of this invention which is mounted on base mount 12 mounted on the floor, such base mount 12 engaging upright member 14 so that it can allow for 360 degree rotation thereof. Near the top of upright member 14 is wall mount 18 which can be better seen extending from equipment stand 10 in FIGS. 3 and 4 which is attached to a point on a side wall or other appropriate point. The equipment stand then extends in a horizontal fashion by means of horizontal member 20 which at its end curves upward, forming vertical member 22 at the end of which is disposed rotational mount 24. Rotational mount 24 receives a counterbalanced arm 28 mounted therein having the ability to rotate 360 degrees. At the proximal end of counterbalanced arm 28 is first pivot 26 and at the distal end of counterbalanced arm 28 is second pivot 30 which first and second pivots 26 and 30 allow counterbalanced arm 28 to move through a 60 degree range of vertical travel. Counterbalanced arm 28 is seen moved upwards in its range of travel in FIG. 2. First and second pivots 26 and 30 allow cylindrical receiver 32 at the end of counterbalanced arm 28 to be maintained in a vertical position. Counterbalanced arm 28 can include a lower arm and upper arm attached at different points to first and second swivels, not shown, contained respectively within first and second pivots 26 and 30, such upper and lower arms containing a tension spring to apply pressure to aid in maintaining counterbalanced arm 28 in a selected position within its range of movement and lock members can be provided on each of said first and second pivots 26 and 30 to retain counterbalanced arm 28 at the selected angle when such lock members are engaged. The lock members can be released when it is desired to move counterbalanced arm 28 to a new position. Within cylindrical receiver 32 can be attached the mounting arm of a variety of pieces of equipment for use within the intense magnetic force of the magnetic resonance imaging environment. Seen in FIG. 1 is an arterial pressure injector device 38 attached to mount support 36 disposed on the bottom of mounting arm 34 for engagement into cylindrical receiver 32 where mounting arm 34 can be rotated 360 degrees. Different forms of medical equipment can be accommodated, maneuvered and conveniently positioned on the end of counterbalanced arm 28 within a magnetic resonance lab and within the intense magnetic force of the magnetic field with the equipment stand of this invention. When mounted against a wall that is higher and wider than equipment stand 10, the rotation of base mount 12 on the floor is restricted to approximately 180 degrees. Because equipment stand 10 of this invention is made of nonferrous materials including, but not limited to, 6060 T5 Aluminum, beryllium copper, beryllium compositions, bronze, brass, nylon and 316L stainless steel, equipment stand 10 does not adversely affect the high intensity magnetic field. The use of nonferrous materials provides for the equipment stand of this invention to function without being moved or otherwise being affected by a strong magnetic field yet still allows for a very wide range of positionings for the selected medical equipment mounted thereon. Constructing the equipment stand of this invention of such nonferrous materials is critical to its function.

Figure 4:
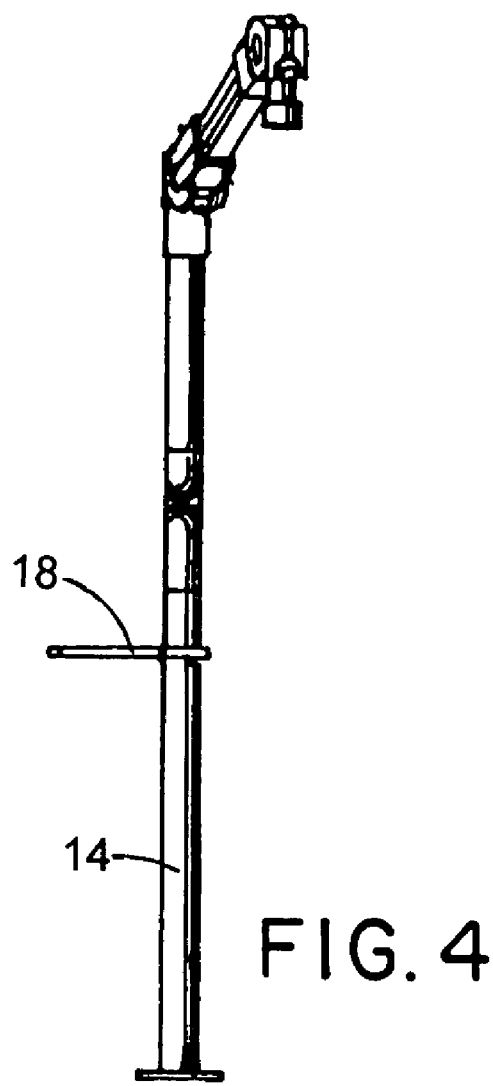
FIG. 4 illustrates a front view of the equipment stand of FIG. 1 showing the wall mount extending therefrom.

FIG. 4 illustrates a front view of equipment stand 10 of FIG. 1 showing wall mount 18 extending therefrom.

Figure 5:
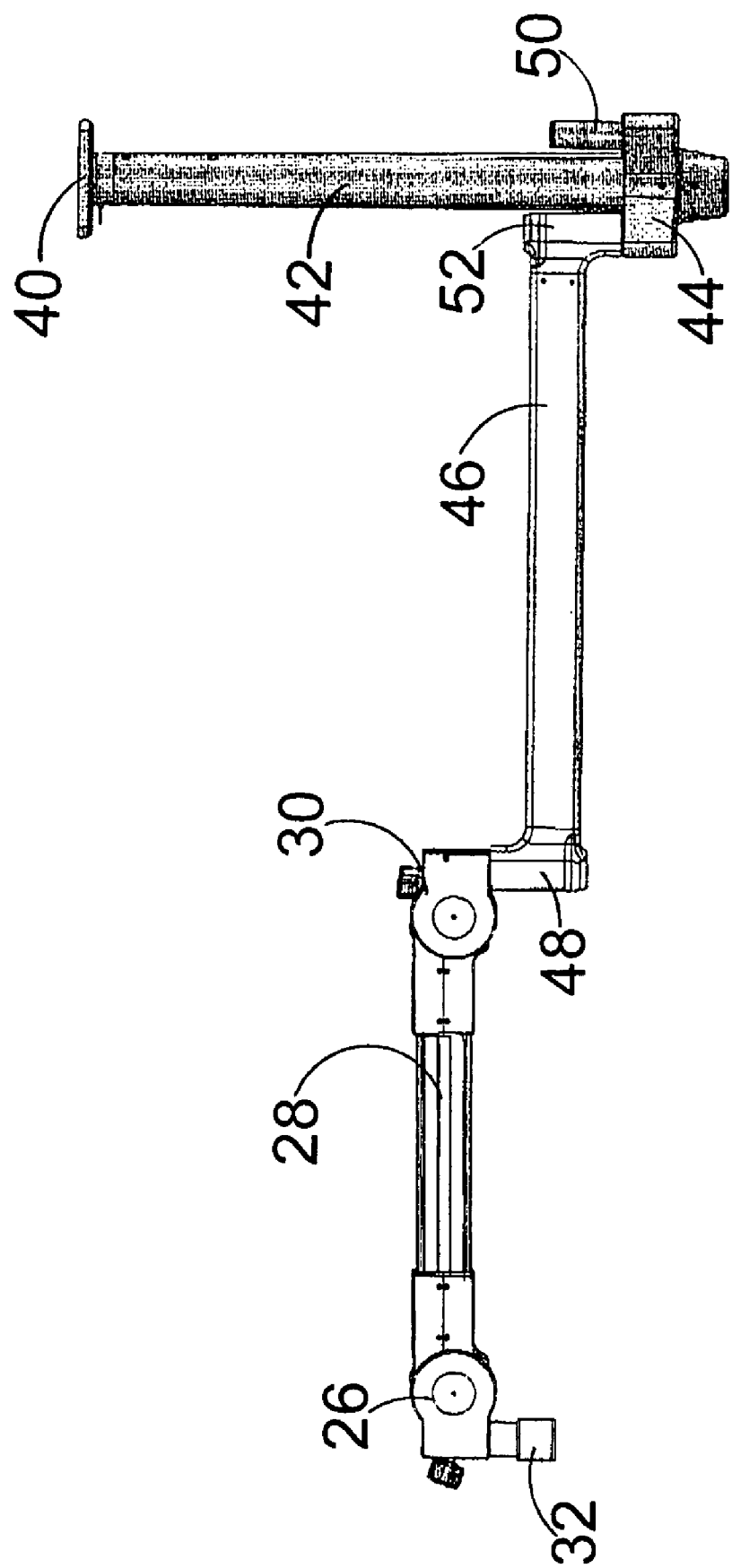
FIG. 5 illustrates a side view of a second embodiment of the device of this invention that is mounted on a ceiling.

FIG. 5 illustrates a second embodiment of the invention wherein counterbalanced arm 28 is supported from the ceiling of a room by ceiling mounting column 42 attached to the ceiling of a room by ceiling mount 40. At the bottom of vertically disposed ceiling mounting column 42 is arm mount support member 44 which has thereon one or more arm mounts 50. At the first end of horizontally disposed ceiling arm 46 is ceiling arm mount 52 which is rotatably engaged on one of said arm mounts 50. At the second end of ceiling arm 46 is counterbalanced arm support 48 into which is rotatably engaged second pivot 30 of counterbalanced arm 28, allowing counterbalanced arm 28 to be rotated horizontally in counterbalanced arm support 48 and also to be maneuvered upwards and downwards within the range of movement of counterbalanced arm 28 which has at its first end first pivot 26 and cylindrical receiver 32 for receipt therein of mounting arm 34 which is not seen in this illustration but is mounted the same as seen in FIG. 1.

Although the present invention has been described with reference to particular embodiments, it will be apparent to those skilled in the art that variations and modifications can be substituted therefor without departing from the principles and spirit of the invention.

I claim:

1. A magnetic resonance imaging equipment stand for holding selected medical equipment, comprising:
   a support means;
   a counterbalanced arm having a first end and a second end, said counterbalanced arm being adjustable to be fixed at a selected angle, said first end rotatably engaged to said support means;
   a tension spring in said counterbalanced arm for applying pressure and maintaining said counterbalanced arm in a selected position;
   a mounting arm having a first end and a second end, said mounting arm vertically disposed parallel to said vertical member and rotatably attached to said second end of said counterbalanced arm, said mounting arm extending downward; and
   a mount support disposed at said second end of said mounting arm for receipt thereon of one of said selected medical equipment required to be operated within a highly magnetic environment of a magnetic resonance medical engaging system.

2. The device of claim 1 wherein all of its components are made of nonmagnetic materials.

3. A magnetic resonance imaging equipment stand for holding selected medical equipment, comprising:
   a support means;
   a counterbalanced arm having a first end and a second end, said counterbalanced arm being adjustable to be fixed at a selected angle, said first end rotatably engaged to said support means;
   a mounting arm having a first end and a second end, said mounting arm vertically disposed parallel to said vertical member and rotatably attached to said second end of said counterbalanced arm, said mounting arm extending downward;
   a mount support disposed at said second end of said mounting arm for receipt thereon of one of said selected medical equipment required to be operated within a highly magnetic environment of a magnetic resonance medical engaging system;
   wherein said support mean is ceiling-mounted and further includes:
   a ceiling mounting column having first and second ends;
   a ceiling mount attached to the ceiling of a room having said first end of said ceiling mounting column attached thereto, said ceiling mounting column extending vertically from said ceiling;
   an arm mount support member disposed at said second end of said ceiling mounting column; and
   a horizontally disposed ceiling arm having first and second ends, said first end being rotatably mounted on said arm mount and said second end of said ceiling arm rotatably supporting said counterbalanced arm.

4. The device of claim 3 wherein all of its components are made of nonmagnetic materials.

5. A magnetic resonance imaging equipment stand for positioning on a floor said stand for holding selected medical equipment, comprising:
   a vertically disposed upright member having a first end and a second end;
   a base disposed at said first end of said upright member, said base mounted to said floor;
   a horizontal member having a first end and a second end, said horizontal member rotatably engaged at a 90 degree angle to said upright member;
   a vertical member having a first end and a second end, said first end rotatably engaged to said second end of said horizontal member, said vertical member extending upwards;
   a counterbalanced arm having a first end and a second end, said counterbalanced arm being adjustable to be fixed at a selected angle, said first end rotatably engaged to said second end of said vertical member;
   a mounting arm having a first end and a second end, said mounting arm vertically disposed parallel to said vertical member and rotatably attached to said second end of said counterbalanced arm, said mounting arm extending downward; and
   a mount support disposed at said second end of said mounting arm for receipt thereon of one of said selected medical equipment required to be operated within a highly magnetic environment of a magnetic resonance medical engaging system.

6. The device of claim 5 when positioned near a wall further including a wall support member positioned at said second end of said upright member for attaching said upright member to said wall.

7. The device of claim 5 wherein all of its components are made of nonmagnetic materials.

8. The device of claim 6 wherein all of its components are made of nonmagnetic materials.

* * * * *